(12) United States Patent  
Kepley et al.

(10) Patent No.: US 8,929,099 B2  
(45) Date of Patent: Jan. 6, 2015

(54) BI-DIRECTIONAL DC/DC CONVERTER AND BATTERY TESTING APPARATUS WITH CONVERTER

(75) Inventors: Kevin Kepley, Ballwin, MO (US); Jonathan W. Kimball, Rolla, MO (US)

(73) Assignee: Bitrode Corporation, Fenton, MO (US)

(*) Notice: Subject to any disclaimer, the term of this patent is extended or adjusted under 35 U.S.C. 154(b) by 1104 days.

(21) Appl. No.: 12/893,380

(22) Filed: Sep. 29, 2010

(65) Prior Publication Data

US 2012/0074949 A1 Mar. 29, 2012

(51) Int. Cl.
*H02M 3/335* (2006.01)
*G01R 31/36* (2006.01)

(52) U.S. Cl.
CPC .......... *H02M 3/33584* (2013.01); *G01R 31/36* (2013.01)
USPC .......... 363/17; 363/21.09; 363/21.11

(58) Field of Classification Search
USPC ................................. 363/20–21.11
See application file for complete search history.

(56) References Cited

U.S. PATENT DOCUMENTS

| | | | | |
|---|---|---|---|---|
| 4,597,026 A * | 6/1986 | Santurtun et al. | ............. | 361/101 |
| 4,860,185 A * | 8/1989 | Brewer et al. | ............. | 363/41 |
| 7,208,928 B2 * | 4/2007 | Nebrigic et al. | ............. | 323/285 |
| 2002/0017897 A1 * | 2/2002 | Wilcox et al. | ............. | 323/282 |
| 2002/0125941 A1 * | 9/2002 | Nguyen | ............. | 330/10 |
| 2009/0195229 A1 * | 8/2009 | Balakrishnan et al. | ............. | 323/277 |
| 2009/0273738 A1 * | 11/2009 | Fukumoto | ............. | 349/70 |
| 2011/0075584 A1 * | 3/2011 | Teramoto | ............. | 370/252 |
| 2012/0043954 A1 * | 2/2012 | Lin et al. | ............. | 323/284 |

OTHER PUBLICATIONS

Powerpoint Presentation entitled Advances in Power Electronics Design dated Feb. 11, 2008, 27 pages.
Powerpoint Presentation entitled Missouri S&T dated Jan. 25, 2010, 27 pages.
MI, Chris et al., Isolated DC-DC Converter for Hybrid Electric Vehicle Energy Management Applications, 13 pages.

* cited by examiner

*Primary Examiner* — Adolf Berhane
*Assistant Examiner* — Nusrat Quddus
(74) *Attorney, Agent, or Firm* — Senniger Powers LLP

(57) ABSTRACT

A bi-directional DC/DC converter includes at least one module having a module input for providing a bi-directional module input current, and a module output with an output inductor for providing a bi-directional module output current. A transformer has a primary winding wound around a transformer core and connected to the module input, and a secondary winding wound around the core and connected to the module output. A primary set of switches is connected in an H-bridge configuration between the module input and the primary winding. And, a secondary set of switches is connected in an H-bridge configuration between the module output and the secondary winding. A current sensing component senses the module output current. A hysteretic control drives the primary set of switches to control flux. The hysteretic control drives the secondary set of switches to control the module output current as a function of the sensed module output current.

19 Claims, 16 Drawing Sheets

BI-DIRECTIONAL DC/DC CONVERTER AND BATTERY TESTING APPARATUS WITH CONVERTER

BACKGROUND OF THE INVENTION

A battery charger allows power to be stored in loads, such as batteries or ultra capacitors, by applying electric current supplied during programmed charging cycles. During charging, electric power is generally drawn from a three phase alternating current power supply and supplied to the load with direct current of variable intensity during separate periods which are programmable depending on the type of load being charged. The battery charger accordingly includes a stage for converting the electric power from the power supply from alternating current to direct current. The battery charger may also include components that condition and control the direct current before it is provided to the load. In addition to charging the load, the battery charger may also be configured to draw power from the load during programmed discharging cycles.

A battery simulator converts power from the power supply in order to provide an output power characteristic of power that is provided by a battery. The battery simulator is accordingly configured to act as a load independent voltage source, and includes a variable resistance that is adjusted based on parameters of the battery being simulated.

In the sector for the production of high, medium, and low amperage batteries there exits a need to effectively control the charging process so as to allow optimum management of the power drawn from the power supply and optimize the battery charging efficiency. There is also a need for battery simulators configured to accurately and efficiently simulate characteristics of the battery for the purpose of testing the drivetrain. The need for such a battery charger and/or battery simulator (broadly referred to as "a battery testing apparatus" or "battery testing system") has grown with the gain in market support for electric vehicles (EVs) and hybrid electric vehicles (HEVs).

SUMMARY OF THE INVENTION

The present invention relates to a bi-directional DC/DC converter. In one embodiment, the bi-directional DC/DC converter includes a plurality of modules connected in parallel with one another for efficiently transferring power between a high voltage system and a low voltage system. For example, the bi-directional DC/DC converter may used as a battery charger/discharger. Additionally or alternatively, the DC/DC converter may be used as a battery simulator. As used herein, the term battery testing apparatus means a battery charger/discharger and/or a battery simulator.

In one embodiment, the present invention relates to a bi-directional battery testing apparatus having a power input adapted for connecting to a power source and a load output adapted for connecting to a load (e.g., battery, ultra capacitor, resistance). The plurality of modules are connected in parallel with one another between the power input and the load output. Each module includes a primary set of switches having an H-bridge configuration, a secondary set of switches having an H-bridge configuration, a transformer isolating the primary set of switches from the secondary set of switches, and a hysteretic control for driving the secondary set of switches to control a module output parameter.

In addition to the plurality of modules, the bi-directional battery testing apparatus includes a current sensing component and a controller. The current sensing component is connected to the load output for sensing a total current at the load output and for generating a current feedback signal representative of the sensed total current. The controller receives the current feedback signal from the current sensing component and, responsive thereto, provides a current module command signal to the hysteretic control of each of the plurality of modules. The current module command signal is based on a difference between the sensed total current and a target current. The hysteretic control of each module drives the secondary set of switches of the module as a function of the current module command signal to control a module output current.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION

Figure 1:
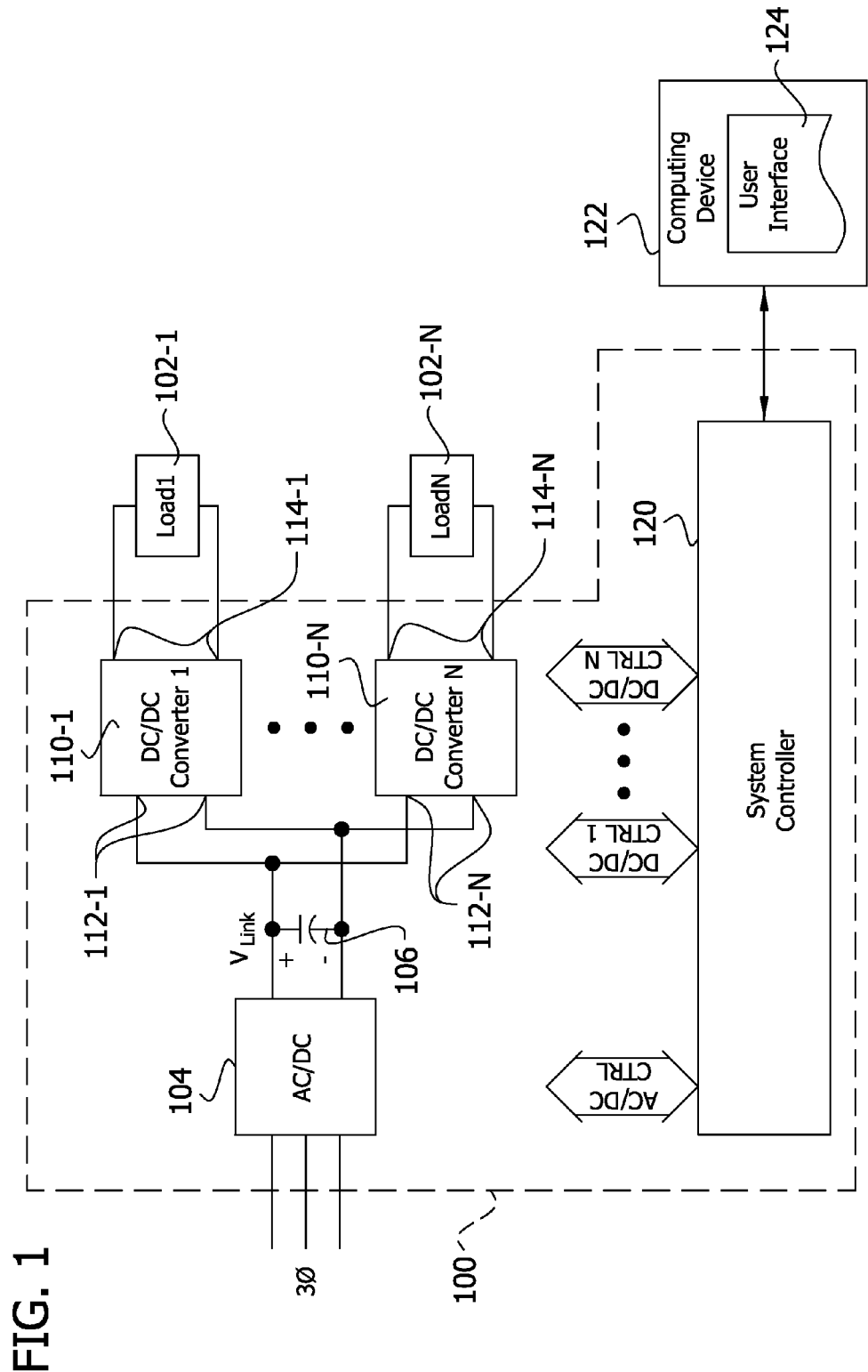
FIG. 1 is a block diagram illustrating an exemplary battery testing system in accordance with an embodiment of the invention.

FIG. 1 illustrates an exemplary battery testing system 100 (e.g., battery charger/discharger and/or battery simulator) in accordance with an embodiment of the invention. In one embodiment, the battery testing system 100 is configured for bi-directionally charging (e.g., charging and discharging) a load 102 (e.g., battery, ultra capacitor). For example, the battery testing system 100 may be configured to selectively charge and discharge a battery for an electric vehicle or hybrid electric vehicle in order to test the battery.

The battery testing system 100 is adapted for connecting to an alternating current (AC) power source. For example, the AC power source may be a three phase 480 Volt industrial electric network. The battery testing system 100 includes an alternating current to direct current (AC/DC) converter 104 for converting between AC power and DC power. According to the illustrated embodiment, the AC/DC converter 104 has an AC power input and a DC power output. The power source is connected to the AC power input (e.g., three phase, as shown in FIG. 1). A link capacitor 106 is connected across the DC power output of the AC/DC converter 104 to decouple the AC power source from components connected downstream from the DC power output. The AC/DC converter 104 is configured to operate bi-directionally in order to maintain a substantially constant voltage $V_{LINK}$ across the link capacitor 106.

Referring further to FIG. 1, the battery testing system 100 includes one or more DC to DC (DC/DC) converters 110. Each DC/DC converter 110 has an input terminal 112 for connecting to a power source and an output terminal 114 for connecting to a load 102. In the illustrated embodiment, the input terminal 112 of each DC/DC converter 110 is connected to the link capacitor 106, and the output terminal 114 of each DC/DC converter 110 is connected to a separate (e.g., corresponding) load 102. Each separate load 102 may include one voltage source component (e.g., battery, ultra-capacitor) or a plurality of voltage source components connected in series and/or parallel. Each DC/DC converter 110 is bi-directional in that it is configured to selectively provide current to and draw current from the load 102 connected thereto.

A system controller 120 is connected to the AC/DC converter 104 communicating therewith (indicated by AC/DC CTRL). For example, the system controller 120 may communicate with the AC/DC converter 104 to enable or disable the operation the AC/DC converter 104. The system controller 120 is also connected to the one or more DC/DC converters 110 for communicating with each of the DC/DC converters 110. In the illustrated embodiment (indicated by DC/DC CTRL 1 to DC/DC CTRL N), the system controller 120 is separately connected to each DC/DC converter 110 for individually controlling operation of the DC/DC converter 110. Specifically, the system controller 120 transmits a DC/DC converter command signal (e.g., $I_{cmd}$, $V_{cmd}$) to each DC/DC converter 110 with command data for operating the DC/DC converter 110. For example, a DC/DC converter command signal, $I_{cmd}$, may be transmitted to the DC/DC converter 110 to specify a target output current (i.e., commanded current value) for the DC/DC converter 110. In one embodiment, the system controller 120 generates the DC/DC converter command signal based on pre-programmed parameters. In an alternative embodiment, the system controller 120 generates the DC/DC converter command signal based on user-defined parameters.

For example, in the illustrated embodiment of FIG. 1, the system controller 120 is adapted for communicating with a computing device 122 (e.g., via cable or wireless connection). The computing device 122 includes a memory that stores computer executable instructions which provide a user interface 124. The user interface 124 allows a user to specify, for one or more of the DC/DC converters 110, parameters governing the current flow between the DC/DC converter 110 and the load 102 connected thereto. For example, the user interface 124 may allow a user to specify a sequence of charging/discharging steps. For each step, the user interface 124 allows a user to enter a current direction (i.e., a positive current would represent current flowing from the DC/DC converter 110 to the load 102 to charge the load 102, a negative current would represent current flowing from the load 102 to the DC/DC converter 110 to discharge the load 102), a current amplitude, and a current duration (e.g., length of time that current of the specified amplitude and direction is applied). The parameters specified by the user via the user interface 124 ("user-specified parameters") are communicated to the system controller 120. The system controller 120 receives the user-specified parameters from the computing device 122, and generates the DC/DC converter command signal as a function of the user-specified parameters.

In operation, the system controller 120 controls the operation of each DC/DC converter 110 via the DC/DC converter command signal in order to selectively charge (e.g., provide positive current) and discharge (e.g., provide negative current) the load 102 at the output terminal 114 of the DC/DC converter 110. In order to maintain the substantially constant voltage across the link capacitor 106, when the sum of the currents into the loads 102 is negative, power flows from the battery testing system 100 to the AC power source. Accordingly, the AC/DC converter 104 receives power from the one or more DC/DC converters 110 via the DC power output and converts the DC power to AC power which flows into the power source. On the other hand, when the sum of the currents into the loads 102 is positive, power flows from the power source into the battery testing system 100. The AC/DC converter 104 receives AC power from the AC power source via the AC power input and converts the AC power to DC power.

Figure 2:
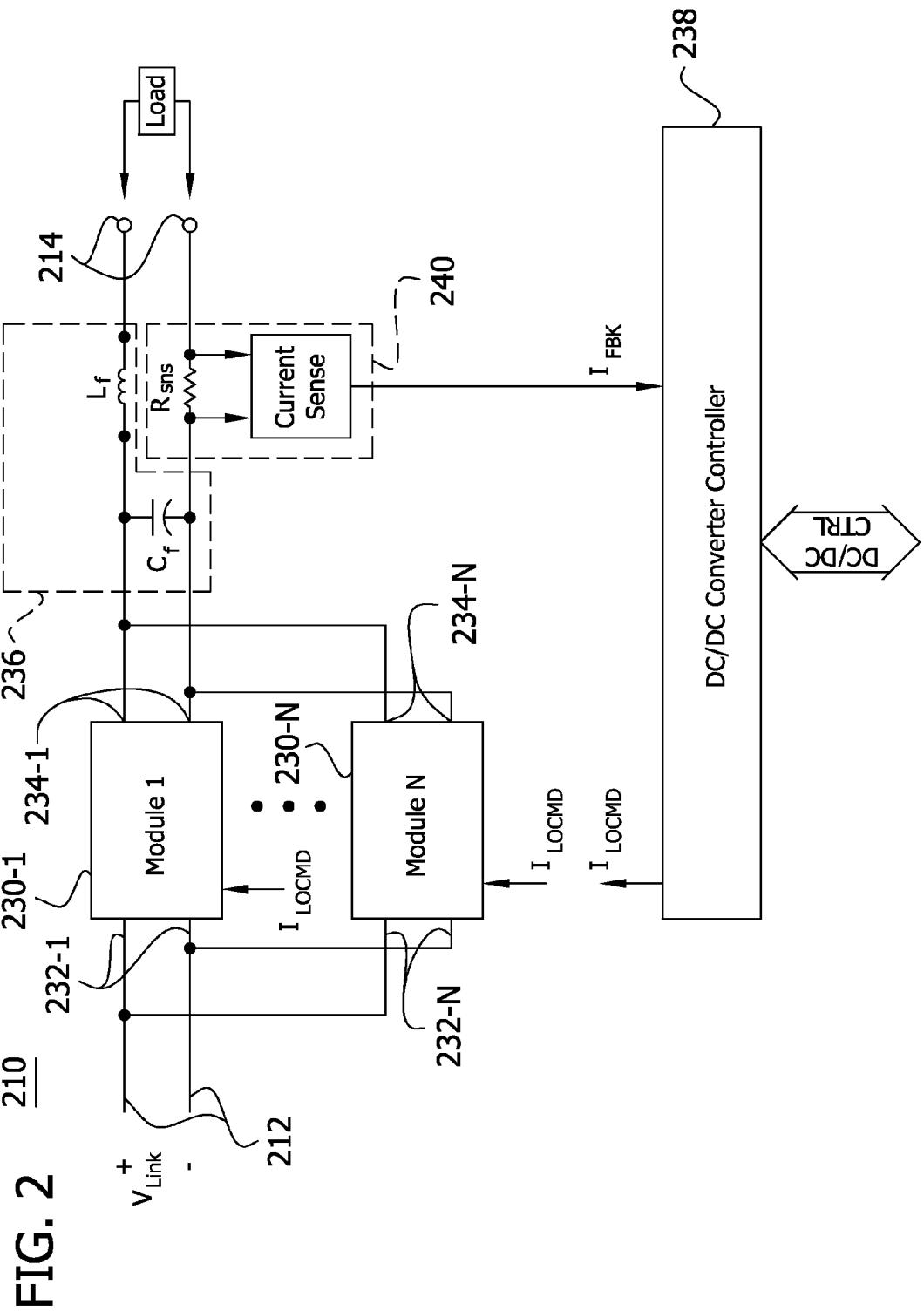
FIG. 2 is a block diagram illustrating an exemplary DC/DC converter 210 suitable for use as DC/DC converter 110 in the battery testing system 100 in accordance with an embodiment of the invention.

FIG. 2 is a component diagram of an exemplary DC/DC converter 210 suitable for use as DC/DC converter 110 in the battery testing system 100 in accordance with an embodiment of the invention. The DC/DC converter 210 includes a bi-directional module 230 (hereinafter "module") connected between a DC/DC converter input terminal 212 and a DC/DC converter output terminal 214. The module 230 has a module input 232 adapted for connecting to the DC/DC converter input terminal 212 for providing a module input current to and from the DC/DC converter input terminal 212. And the module 230 has a module output 234 adapted for connecting to the DC/DC converter output terminal 214 for providing a module output current to and from the DC/DC converter output terminal 214.

A filter 236 is connected between the module 230 and the DC/DC converter output terminal 214 for filtering the module output current provided between the module output 234 and the load 102. In one embodiment, the filter 236 includes a filter capacitor $C_f$ connected across the module output 234 and a filter inductor $L_f$ connected to the filter capacitor $C_f$ so that it is in series with the load 102 when the load 102 is connected to the output terminal 214 of the DC/DC converter 210. In operation, the filter capacitor $C_f$ and the filter inductor $L_f$ reduce ripple current in the load 102.

In the illustrated embodiment of FIG. 2, the DC/DC converter 210 includes a plurality of modules 230, in which each module 230-1 is connected in parallel with each other module 230-N. That is, the module inputs 232 of each of the modules 230 are connected together, and the module outputs 234 of each of the modules 230 are connected together. Accordingly, the filter 236 filters the sum of the module output currents from the plurality of modules 230. In one embodiment, a number of modules N included in the DC/DC converter 210 is based on the load 102 being connected to the DC/DC converter 210. For example, if the modules 230 are each configured to provide 25 amps of current, and the load 102 to be connected to the DC/DC converter 210 is a battery having a 100 amp/hr rating, four modules 230 are preferably included in the DC/DC converter 210 so that the battery can be efficiently charged. If the load 102 being connected to the DC/DC converter 210 is changed to a battery having a greater amp/hr rating, additional modules 230 may be added to the DC/DC converter 210. On the other hand, if the load 102 being connected to the DC/DC converter 210 is changed to a battery having a smaller amp/hr rating, some of the modules 230 may be disconnected from the DC/DC converter 210. In such an embodiment, the DC/DC converter 210 is constructed so that modules 230 can be easily added to (e.g., connected) and removed from (e.g., disconnected) the DC/DC converter 210.

A DC/DC converter controller 238 is in communication with the system controller 120 and with the module(s) 230. The DC/DC converter controller 238 receives the DC/DC converter command signal (e.g., $I_{cmd}$, $V_{cmd}$) from the system controller 120, and generates a module command signal (e.g., $I_{LOCMD}$, $V_{LOCMD}$) for each module 230 based on the DC/DC converter command signal. The module command signal includes command data for operating the module 230. For example, in response to receiving a DC/DC converter command signal from the system controller 120 that specifies the target DC/DC converter output current, the DC/DC converter controller 238 may generate a module command signal that specifies a target module output current based on the target DC/DC converter output current. The DC/DC converter controller 238 provides the generated module command signal to the module 230.

As shown in FIG. 2, in one embodiment, the DC/DC converter controller 238 is also in communication with a sensing component 240. The sensing component 240 is connected between the module output 234 and the DC/DC converter output terminal 214 for sensing a value of a DC/DC converter output parameter, and generating a feedback signal representative of the sensed value. The DC/DC converter controller 238 receives the feedback signal generated by the sensing component 240, and generates a module command signal that is based on both the feedback signal and the DC/DC converter command signal. The DC/DC converter controller 238 may include analog hardware and/or one or more digital devices, such as a digital signal processor or a microcontroller.

In the illustrated embodiment, the sensing component 240 is a current sensing component. A resistor $R_{sns}$ is connected between the module output 234 and the DC/DC converter output terminal 214 for sensing a value of the current output from the DC/DC converter 210 to the load 102. The current sensing component 240 generates a feedback signal $I_{FBK}$ representative of the sensed current value.

Figure 3:
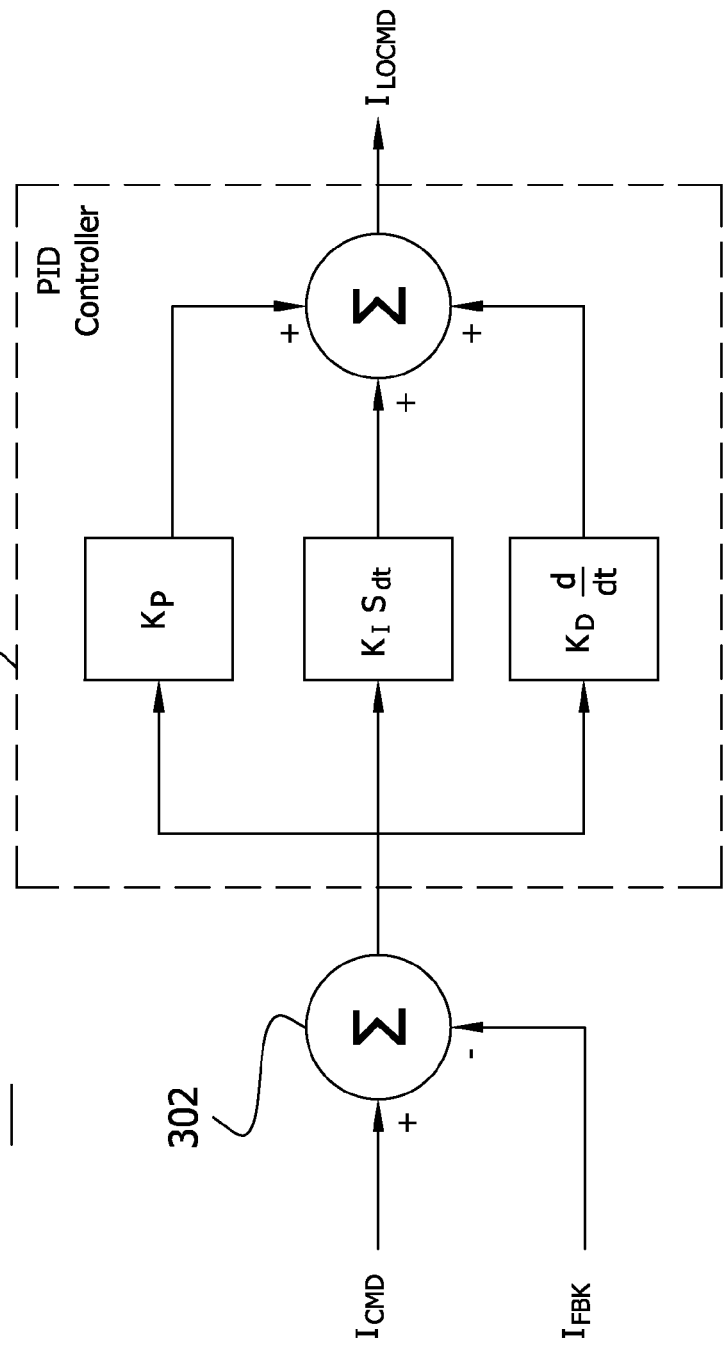
FIG. 3 is a signal flow diagram implemented by a DC/DC converter controller in accordance with an embodiment of the invention.

Referring to FIG. 3, the DC/DC converter controller 238, in one embodiment, may include a difference circuit 302 and a proportional-integral-derivative (PID) controller 304. The difference circuit 302 compares the DC/DC converter command signal $I_{CMD}$ with the feedback signal $I_{FBK}$, to compute the difference (e.g., error signal) between the target output current for the DC/DC converter and sensed current value. The PID controller 304 generates the module command control signal $I_{LOCMD}$ by applying a control algorithm to the computed difference between the target output current for the DC/DC converter and sensed current value.

Figure 4:
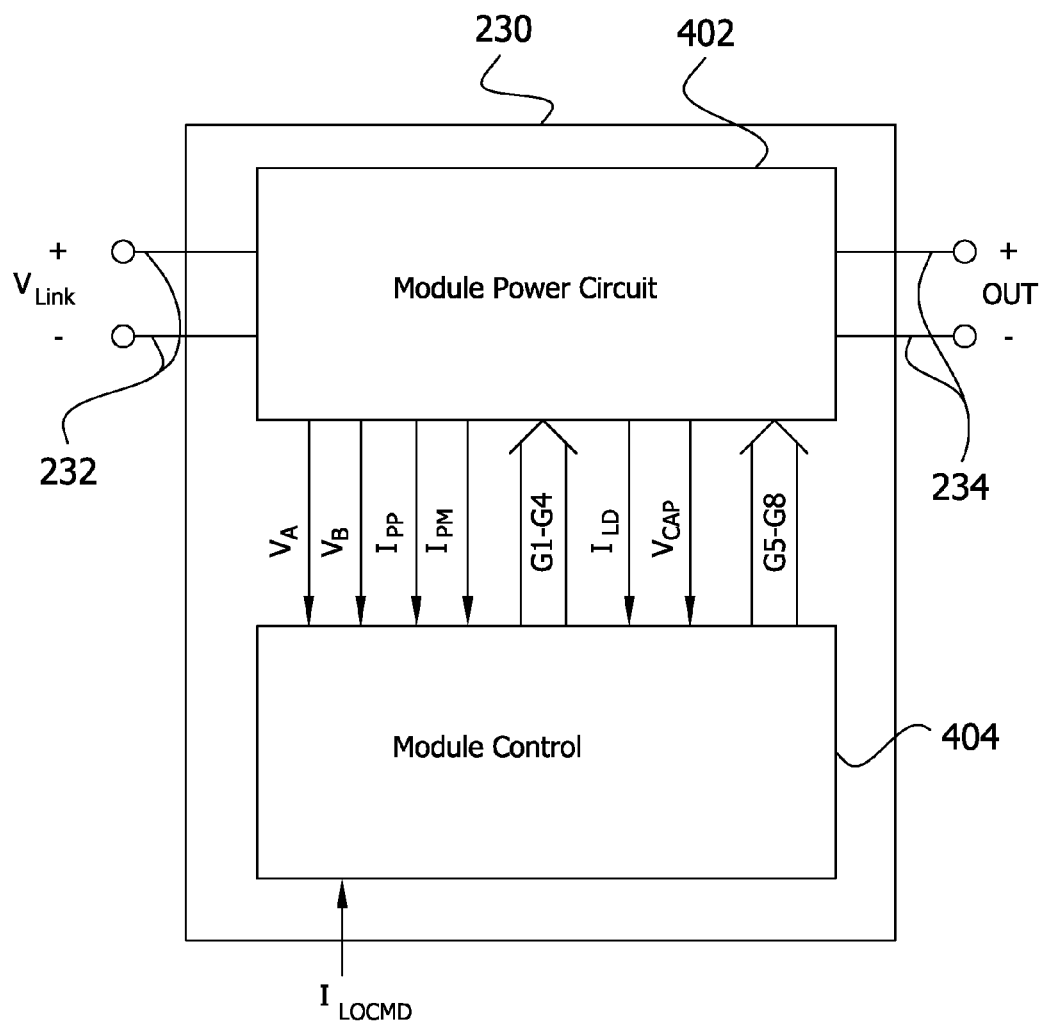
FIG. 4 is a component diagram of a module in accordance with an embodiment of the invention.

As illustrated in FIG. 4, each module 230 includes a module power circuit 402 coupled with a module control 404. The module control 404 is in communication with the DC/DC converter controller 238 for receiving the module command control signal (e.g., $I_{LOCMD}$) therefrom. The module control 404 also receives module feedback signals from the module power circuit 402. As described in detail below, the module control 404 controls the operation of the module power circuit 402 as a function of the module command control signal (e.g., $I_{LOCMD}$) and the module feedback signals.

Each of the individual modules 230 has a very fast rise time, limited primarily by inductance in the module (e.g., due to hysteretic control). The rise time of the DC/DC converter 210 must be slower than the rise time of each of the individual modules 230. The rise time of the DC/DC converter 210 is determined by the filter 236 and the DC/DC controller 238. The filter 236 limits the rise time of the DC/DC converter 210 in order to reduce ripple current. The DC/DC controller 238 is configured to maximize the rise time of the DC/DC converter 210 without causing overshoot and subject to the limitations imposed by the filter 236.

Figure 5:
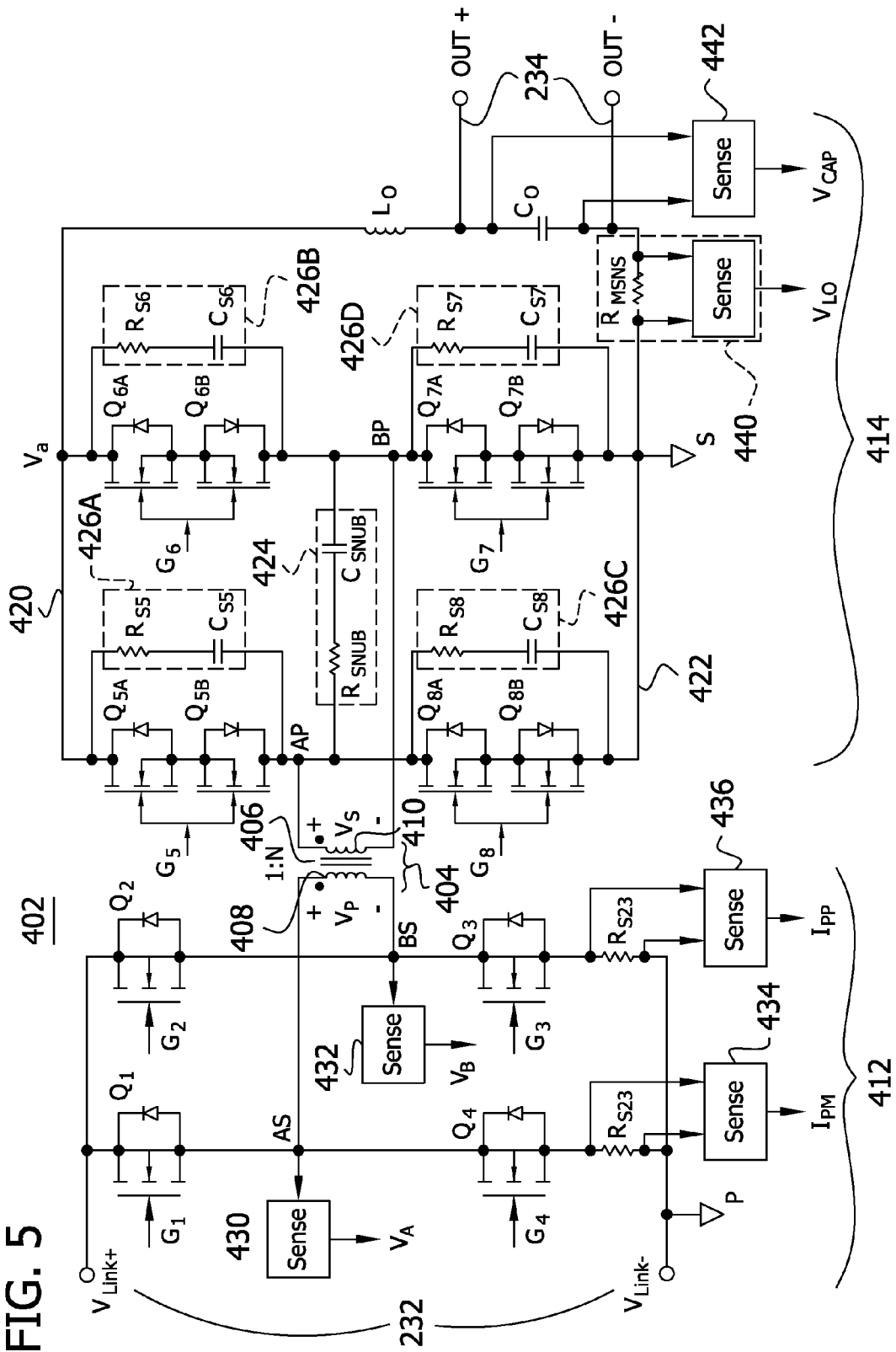
FIG. 5 is a combination schematic-block diagram of a module power circuit in accordance with an embodiment of the invention.

FIG. 5 is combination schematic-block diagram of an exemplary module power circuit 402 according to an embodiment of the invention. As illustrated, the module power circuit 402 includes dual H-bridges coupled by a transformer 404. The transformer 404 has a core 406, a primary winding 408, and a secondary winding 410. The primary winding 408 is wound around the core 406 and connected to the module input 232. A primary side circuit 412 is connected between the primary winding 408 and the module input 232. The secondary winding 410 is wound around the core 406 and connected to the module output 234. A secondary side circuit 414 is connected between the secondary winding 410 and the module output 234. Thus, the primary side circuit 412 and the secondary side circuit 414 are isolated from each other. Likewise, the module input 232 is isolated from the module output 234. It should be noted that although referenced herein using the terms "primary" and "secondary," the ordinary meaning of these terms as used in relation to a transformer applies only when the direction of the power flow in the module is from the input to the output.

As shown in FIG. 5, the primary side circuit 412 includes a primary set of switches (e.g., primary switches Q1, Q2, Q3, and Q4) connected in an H-bridge configuration with the module input 232 and the primary winding 408. As illustrated, the H-bridge configuration of primary switches comprises a first leg and a second leg, each connected across the module input 232, and coupled together by the primary winding 408. The first leg is formed by primary switches Q1 and Q4, and the second leg is formed by primary switches Q2 and Q3. The secondary side circuit 414 includes a high voltage bus 420, a low voltage bus 422, and a secondary set of switches (e.g., secondary switches Q5, Q6, Q7, and Q8) connected in an H-bridge configuration with the high voltage bus 420, low voltage bus 422, and secondary winding 410. As illustrated, the H-bridge configuration of secondary switches comprises a first leg and a second leg, each connected between the high voltage bus 420 and the low voltage bus 422, and coupled together by the secondary winding 410. The first leg is formed by secondary switches Q5 and Q8, and the second leg is formed by secondary switches Q6 and Q7.

In one embodiment, the primary and secondary switches are metal-oxide-semiconductor field-effect transistors (MOSFETs). However, insulated gate bipolar transistors (IGBTs) or other switching devices known in the art may be used. In operation, the secondary switches are used to block bi-directional current flow. As such, in the illustrated embodiment, each of the secondary switches Q5, Q6, Q7, and Q8 comprises two MOSFETs arranged in a back-to-back configuration with respect to one another. Thus, switch Q5 comprises MOSFETs Q5A and Q5B which are connected to common gate terminal G5. Switch Q6 comprises MOSFETs Q6A and Q6B which are connected to common gate terminal G6. Switch Q7 comprises MOSFETs Q7A and Q7B which are connected to common gate terminal G7. Switch Q8 comprises MOSFETs Q8A and Q8B which are connected to common gate terminal G8.

When the module 402 is in operation, a leakage inductance associated with the transformer 404 is produced. The leakage inductance carries current, and thus stores energy. In one embodiment, the module power circuit 402 includes one or more snubber circuits for controlling/dissipating the leakage inductance energy in order to prevent damage to the components of the module power circuit 402. For example, the module power circuit 402 may include a snubber circuit 424 comprising a resistor $R_{SNUB}$ and a capacitor $C_{SNUB}$ connected in series across the secondary winding 410 of the transformer 404. Additionally or alternatively, the module power circuit 402 may include a snubber circuit 426 connected across one or more of the switches. As shown in the illustrated embodiment of FIG. 5, a resistor (e.g., $R_{S5}$, $R_{S6}$, $R_{S7}$, $R_{S8}$) and a capacitor (e.g., $C_{S5}$, $C_{S6}$, $C_{S7}$, $C_{S8}$) are connected in series across each of the secondary switches, Q5, Q6, Q7, and Q8.

Figure 6:
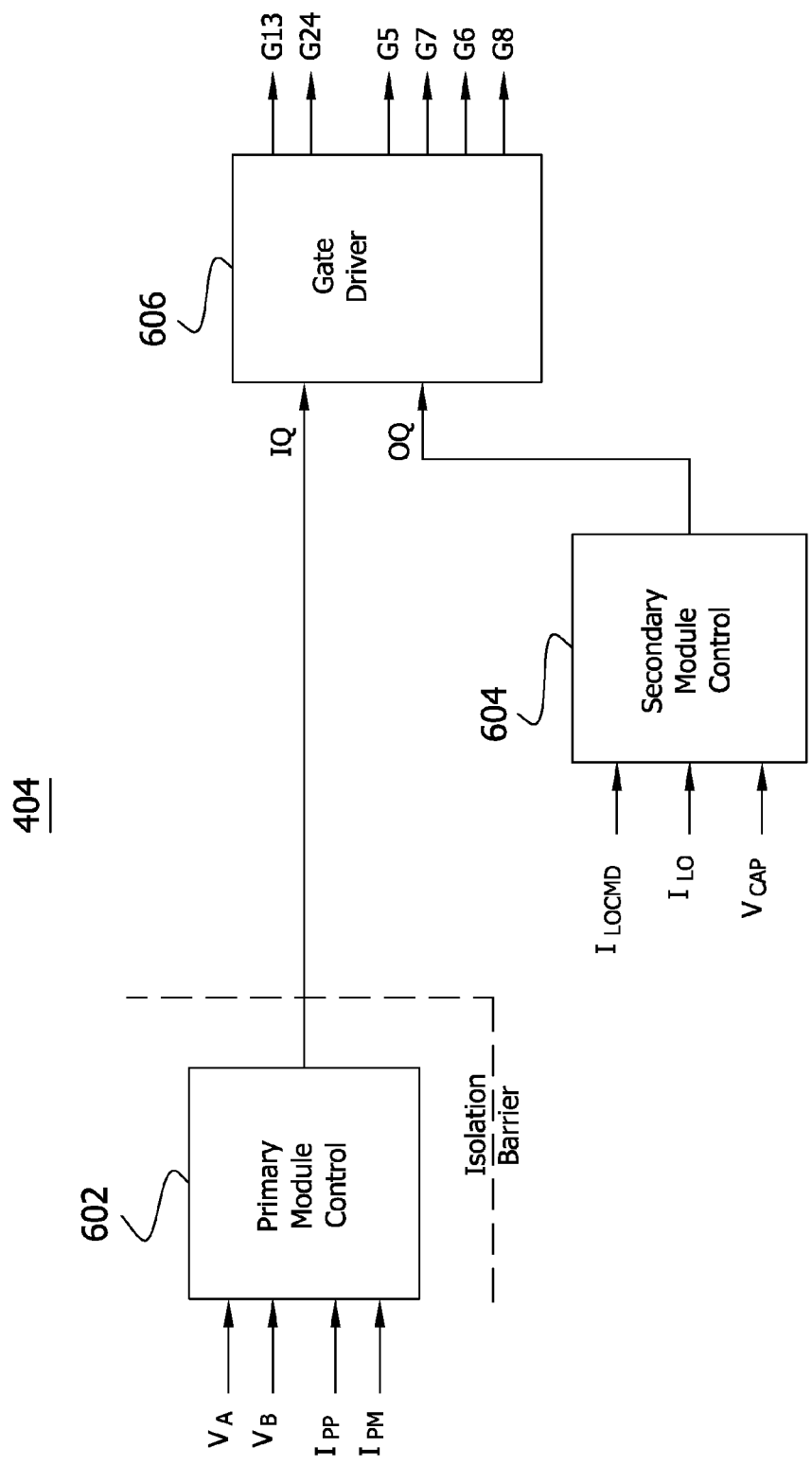
FIG. 6 is a component diagram of a module control in accordance with an embodiment of the invention.

FIG. 6 is a block diagram of an exemplary module control 404 in accordance with an embodiment of the invention. The module control 404 includes a primary module control 602 for determining switching operations for the primary set of switches, such as switches Q1, Q2, Q3, and Q4, in order to control flux (e.g., maintain flux balance) in the transformer core 406. The primary module control 602 generates a primary control signal IQ indicative of the determined switching operations for the primary set of switches. The module control includes a secondary module control 604 for determining switching operations for the secondary set of switches, such as switches Q4, Q5, Q6, and Q7, in order to control the module output current. The secondary module control 604 generates a secondary control signal OQ indicative of the determined switching operations for the secondary set of switches. The module control includes a gate driver 604 connected to the primary and secondary control modules, 602 and 604, for receiving the control signals, IQ and OQ, respectively. The gate driver 606 coordinates the switching operations (e.g., switching sequence) indicated in the control signals, IQ and OQ, and drives the gates of the switches (Q1-Q8) accordingly.

In one embodiment, the primary module control 602 controls the flux in the transformer core 406 based on feedback from the primary side circuit 412 indicative of an estimated flux in the transformer core 406. The flux is estimated based on a voltage sensed across the primary winding 408 and the current sensed through the primary winding 408. As illustrated in FIG. 5, the primary side circuit 412 includes a first voltage sensing component 430 for sensing the voltage $V_A$ at a first (e.g., positive) terminal of the primary winding (i.e., between the switches Q1 and Q4 which form the first leg of the H-bridge configuration), and generating a feedback signal indicative of the sensed voltage $V_A$. A second voltage sensing 432 component is similarly used for sensing the voltage $V_B$ at a second (e.g., negative) terminal of the primary winding 408 (i.e., between the switches Q2 and Q3 which form the second leg of the H-bridge configuration), and generating a feedback signal indicative of the sensed voltage $V_B$. In one embodiment, the voltages sensed, $V_A$ and $V_B$, at the first and second terminals are both positive (e.g., with respect to the P-ground reference). The primary side circuit 412 also includes a first current sensing component 434 for sensing the current $I_{PM}$ flowing in the first leg of the H-bridge configuration between switch Q4 and the ground terminal, and for generating a feedback signal indicative of the sensed current $I_{PM}$. A second sensing component 436 is similarly used for sensing the current $I_{PP}$ flowing in the second leg of the H-bridge configuration between switch Q3 and the ground terminal, and for generating a feedback signal indicative of the sensed current $I_{PP}$.

Figure 7:
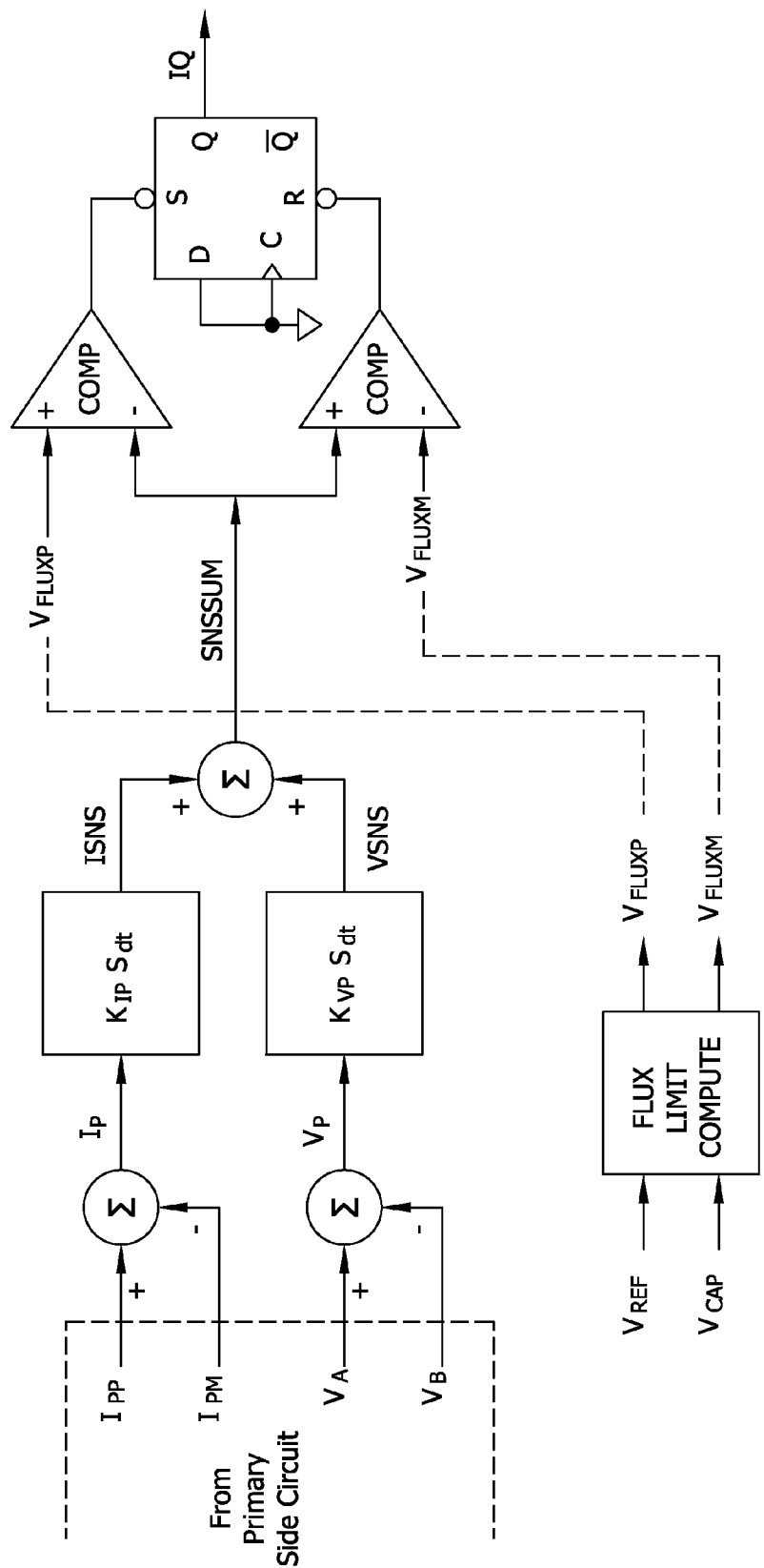
FIG. 7 is a signal flow diagram illustrating operations implemented by a module control for controlling a first set of module switches in accordance with an embodiment of the invention.

The feedback signals (i.e., primary feedback signals) indicative of the sensed voltages, $V_A$ and $V_B$, and of the sensed currents $I_{PM}$ and $I_{PP}$ are transmitted to the module control 404. FIG. 7 is an exemplary signal flow diagram illustrating operations implemented in the primary module control 602 for estimating the flux in the transformer core 406 based on the primary feedback signals and, accordingly, generating the primary control signal IQ for controlling the flux in the transformer core 406. As shown, the primary module control 602 determines the current through the primary winding 408 (represented via signal $I_{SNS}$) by computing a difference signal $I_P$ between the sensed currents (i.e., $I_{PP}$-$I_{PM}$) and filtering the difference signal $I_P$ with an integrator or low pass filter. The primary module control 602 determines the voltage across the primary winding 408 (represented via signal $V_{SNS}$) by similarly computing a difference signal $V_P$ between the sensed voltages (i.e., $V_A$-$V_B$) and filtering the difference signal $V_P$. The signals representing the determined current and determined voltage, $I_{SNS}$ and $V_{SNS}$, are summed to produce a sensed sum signal $SNS_{SUM}$. The sensed sum signal $SNS_{SUM}$ represents an estimation of the flux in the core 406 of the transformer 404. The primary module control 602 applies a hysteretic (e.g., "bang-bang") control to the sensed sum signal $SNS_{SUM}$ so that it is generally constrained between limits $V_{FLUXP}$ and $V_{FLUXM}$ (where $V_{FLUXM}$=negative $V_{FLUXP}$).

Figure 8:
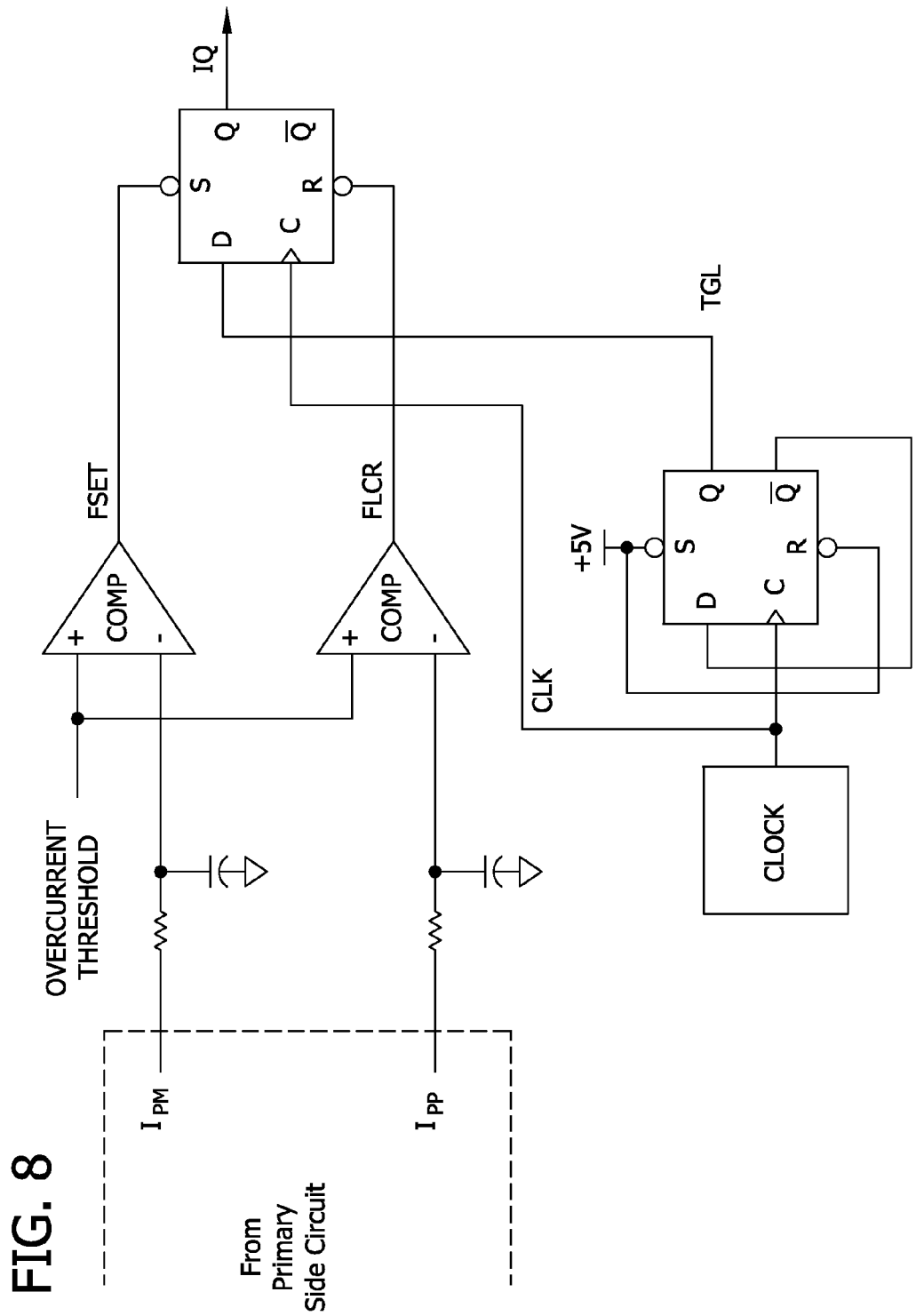
FIG. 8 is a signal flow diagram illustrating operations implemented by a module control for controlling a first set of module switches in accordance with an embodiment of the invention.

In another embodiment, the primary module control 602 controls the flux in the transformer core 406 using a pre-defined switching operating frequency that is adjusted based on feedback received from the primary side circuit 412. FIG. 8 is an exemplary signal flow diagram illustrating operations implemented by the primary module control 602 in accordance with such an embodiment. As shown, the primary module control 602 includes a clock circuit providing a clock signal CLK. A transmission gate logic signal TGL having a particular (e.g., pre-defined, specific) duty cycle is generated from the clock signal CLK (e.g., dividing clock signal CLK). While the particular duty cycle is not limited to a particular value, a 50% duty cycle may be selected since the flux in the core 406 will theoretically remain balanced if a gate drive signal with a 50% duty cycle is exactly applied to the module power circuit 402.

A feedback signal from the primary side circuit 412 is used to adjust (e.g., modify) the particular duty cycle in order to compensate for component and operating imprecisions/errors (e.g., imprecisions in switching times of gate drivers and MOSFETs, resistance introduced upon switch activation). As the flux becomes unbalanced and begins to saturate the core 406 of the transformer 404, the current through the primary winding 408 will begin to rise rapidly. Accordingly, in one embodiment, the feedback signal from the primary side circuit 412 is indicative of the current across the primary winding 408. The primary side circuit 412 includes the first and second current sensing components, 434 and 436, for sensing the current, $I_{PM}$ and $I_{PP}$, respectively, through the first and second legs of the H-bridge, and for generating the feedback signals indicative of the sensed current, $I_{PM}$ and $I_{PP}$. The currents sensed on each side of the primary winding 408, $I_{PM}$ and $I_{PP}$, are compared to a pre-defined threshold overcurrent. If the sensed current, $I_{PM}$ or $I_{PP}$, exceeds the threshold overcurrent, the current cycle of the TGL signal is terminated, which, in turn, changes the switching operation to prevent saturation of the core 406.

In one embodiment, the secondary module control 604 controls the module output current based on a feedback signal from the secondary side circuit 414. Referring to FIG. 5, the secondary side circuit 414 includes a module output inductor $L_O$ connected between the secondary set of switches and the module output 234 for filtering the module output current. The module power circuit 402 includes a current sensing component 440 for sensing the module output current $I_{LO}$ through the inductor $L_O$ and generating a current sense feedback signal indicative of the sensed module output current. The secondary module control 604 receives the command signal from the DC/DC converter controller 238 indicative of the target module output current $I_{LOCMD}$ and the current sense feedback signal from the secondary side circuit 414 indicative of the sensed module output current $I_{LO}$. The secondary module control 604 uses a hysteretic control, for example, to determine the switching operations for the secondary set of switches so that the sensed module output current $I_{LO}$ approximates the target module output current $I_{LOCMD}$. Thus, the module output current is adjusted as a function of a hysteresis (hys) relative to the target module output current $I_{LOCMD}$.

In one embodiment, the hysteresis (hys) varies as a function of a module output voltage in order to keep the switching frequency of the secondary side circuit 414 substantially constant. Referring to again to FIG. 5, the secondary side circuit 414 includes an output capacitor $C_O$ connected across the module output 234. A voltage sensing component 442 senses the voltage across the capacitor $V_{CAP}$ and generates a voltage sense feedback signal indicative of the sensed voltage $V_{CAP}$.

Figure 9:
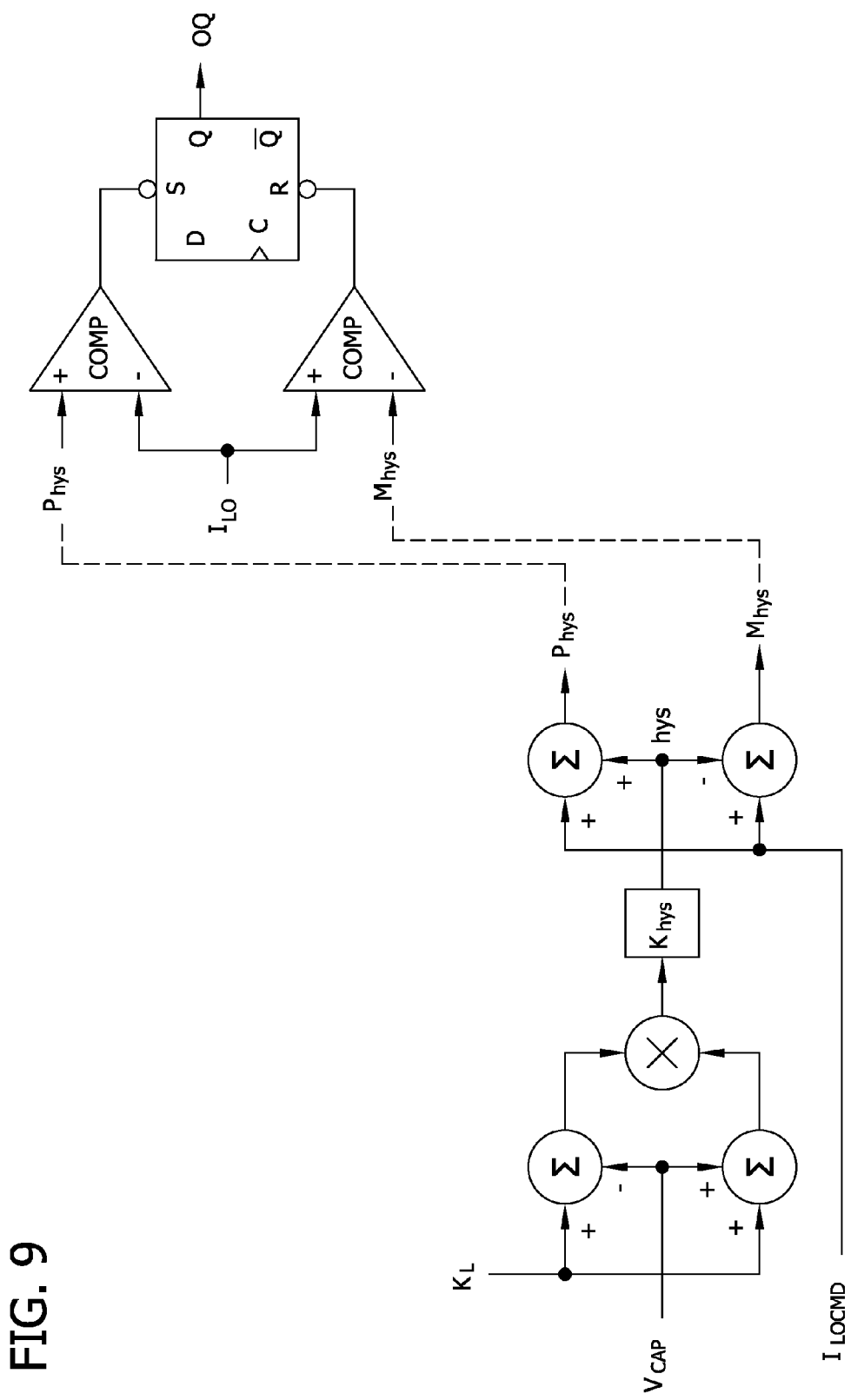
FIG. 9 is a signal flow diagram illustrating operations implemented by a module control for controlling a second set of module switches in accordance with an embodiment of the invention.

FIG. 9 is a signal diagram illustrating operations implemented by the secondary module control 604 to generate the secondary control signal OQ for operating the secondary set of switches in accordance with such an embodiment of the invention. The secondary module control 604 receives the voltage sense feedback signal indicative of the sensed voltage $V_{CAP}$ from the secondary side circuit 414 and computes the hysteresis (hys) according to the following equation $$hys = K_{hys}(K_L - V_{CAP})(K_L + V_{CAP})$$

An upper hysteretic limit $P_{hys}$ that is greater than the target module output current $I_{LOCMD}$, and a lower hysteretic limit $M_{hys}$ that is less the target module output current $I_{LOCMD}$ are computed, as follows $$P_{hys} = I_{LOCMD} + hys$$

$$M_{hys} = I_{LOCMD} - hys$$

Comparators then compare the sensed module output current $I_{LO}$ to upper hysteretic limit $P_{hys}$ and to lower hysteretic limit $M_{hys}$. The secondary control signal OQ is generated based on the comparison.

Figure 10:
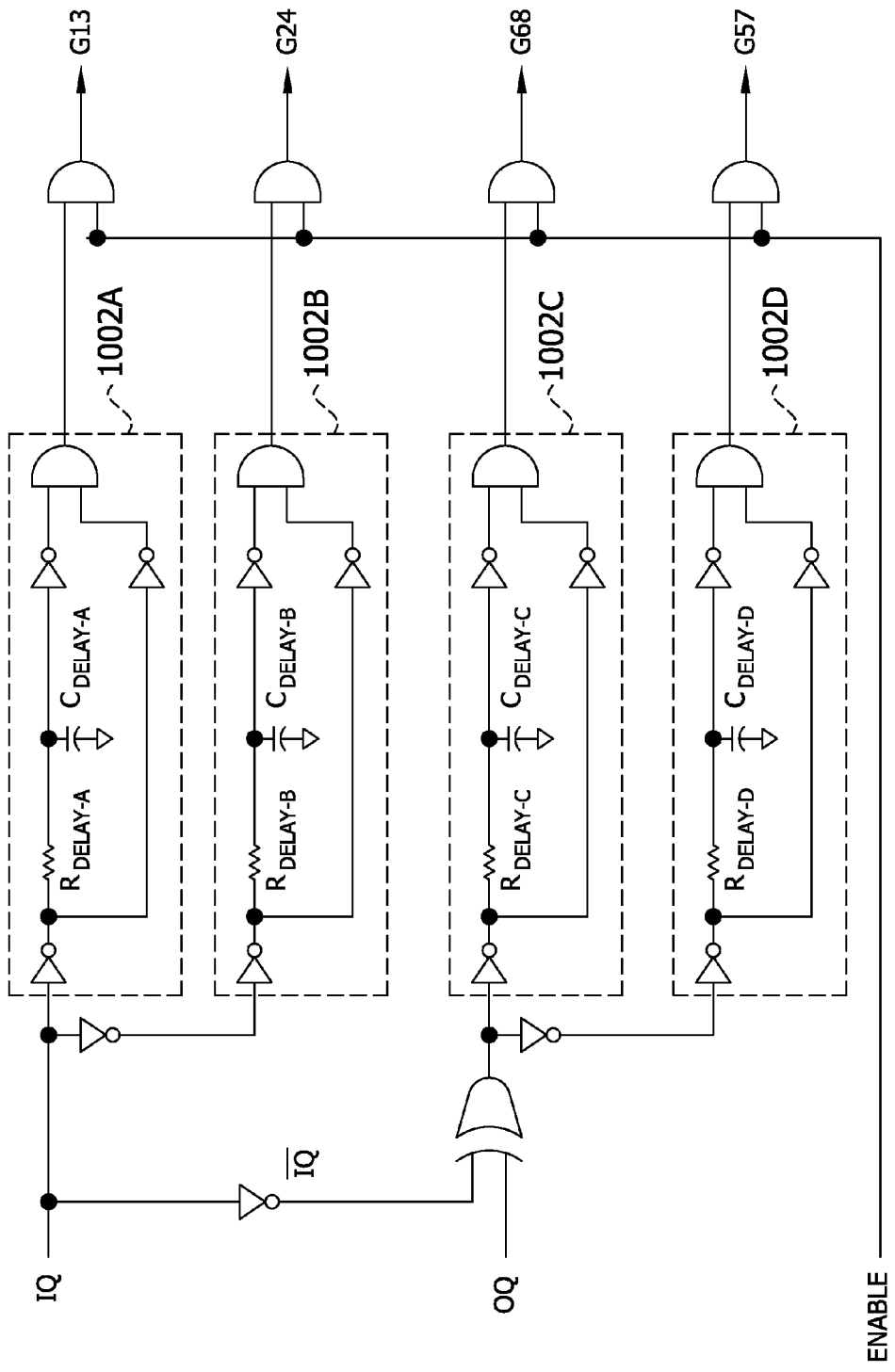
FIG. 10 is an exemplary logic gate diagram illustrating the logical operations implemented by a module control for driving module switches in accordance with an embodiment of the invention.

FIG. 10 is an exemplary logic gate diagram illustrating the logical operations implemented by the gate driver 606 in order to generate the gate drive signals for operating the primary and secondary sets of switches based on the primary and secondary control signals, IQ and CQ. In an embodiment of the invention, the gate driver 606 includes an enable signal that when off, prevents the gate drive signals G13, G24, G68, G57 from activating the respective switches Q1 and Q3, Q2 and Q4, Q6 and Q8, Q5 and Q7.

The primary set of switches are driven as a function of the primary control signal IQ. In particular, a boolean not signal $\overline{IQ}$ of the primary control signal is generated. Primary switches Q1 and Q3 are driven via gate drive signal G13 from the primary control signal IQ. Primary switches Q2 and Q4 are driven via gate drive signal G24 from the boolean not signal $\overline{IQ}$ of the primary control signal. As such, switches Q1 and Q3 are driven (e.g., operated) alternately with switches Q2 and Q4. In the illustrated embodiment, an asymmetrical delay is applied to signals IQ and $\overline{IQ}$ via non-overlap circuits, 1002A and 1002B, to generate gate drive signals, G13 and G24, respectively. The asymmetrical delay ensures that switches Q1 and Q4 are not on (e.g., activated) at the same time. Similarly, the asymmetrical delay ensures that switches Q2 and Q3 are not on at the same time. As such, the asymmetrical delay prevents the occurrence of "shoot-through" (i.e., shorting out $V_{LINK}$) in the primary set of switches.

Figure 11:
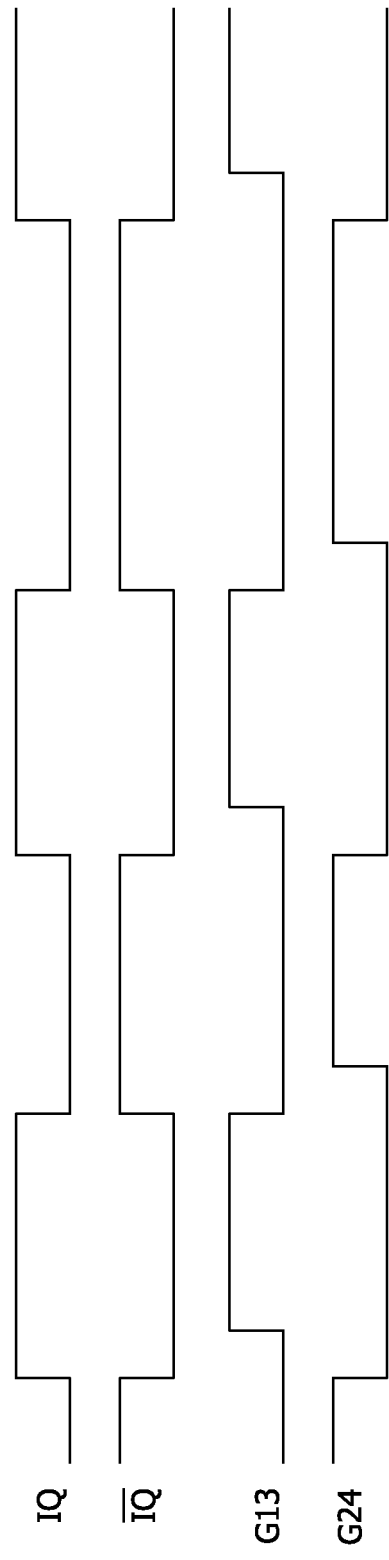
FIG. 11 shows an exemplary timing diagram illustrating command signals, IQ and $\overline{IQ}$, and corresponding gate drive signals, G13 and G24, in accordance with an embodiment of the invention.

FIG. 11 shows an exemplary timing diagram for the command signals, IQ and $\overline{IQ}$, and for the gate drive signals, G13 and G24, which are generated as a function of IQ and $\overline{IQ}$. As shown in the timing diagram of FIG. 11, the non-overlap circuits, 1002A and 1002B, delay the rising edge of each cycle of the signals, IQ and $\overline{IQ}$, respectively, by a delay period. Each of the non-overlap circuits, 1002A and 1002B, includes a resistor $R_{DELAY}$ and a capacitor $C_{DELAY}$ which define the delay period.

Figure 12:
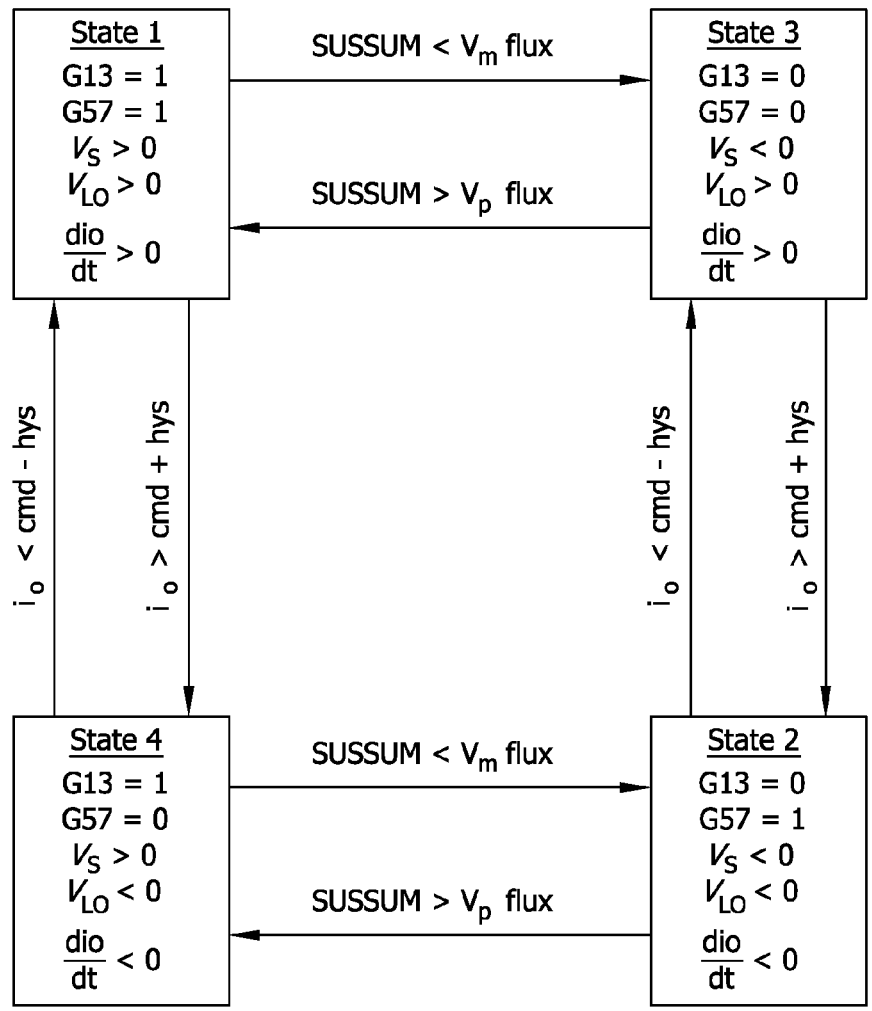
FIG. 12 is a state diagram illustrating switching states of module switches in accordance with an embodiment of the invention.

The gate driver 606 correlates the switching operations of the secondary set of switches with those of the primary set of switches to control the current $I_{LO}$ through the inductor $L_O$. In particular, gate drive signal G68 in this embodiment activates switches Q6 and Q8 only if the condition is true that, both, the secondary control signal and the boolean not of the primary control signal $\overline{IQ}$ are high. Gate drive signal G57 activates switches Q5 and Q7 only if the condition is not true. As such, switches Q6 and Q8 are driven alternately with switches Q5 and Q7. Similar to the discussion above in connection with non-overlap circuits 1002A and 1002B, an asymmetrical delay is applied via non-overlap circuits, 1002C and 1002D, to generate gate drive signals G68 and G57, respectively, so that switches Q6 and Q8 are never on at the same time as switches Q5 and Q7. According to an embodiment implementing the gate logic illustrated in FIG. 10, the module power circuit 402 may be operated in four different states. FIG. 12 is a state diagram showing the four different operation states of the module power circuit 402.

Figure 13:
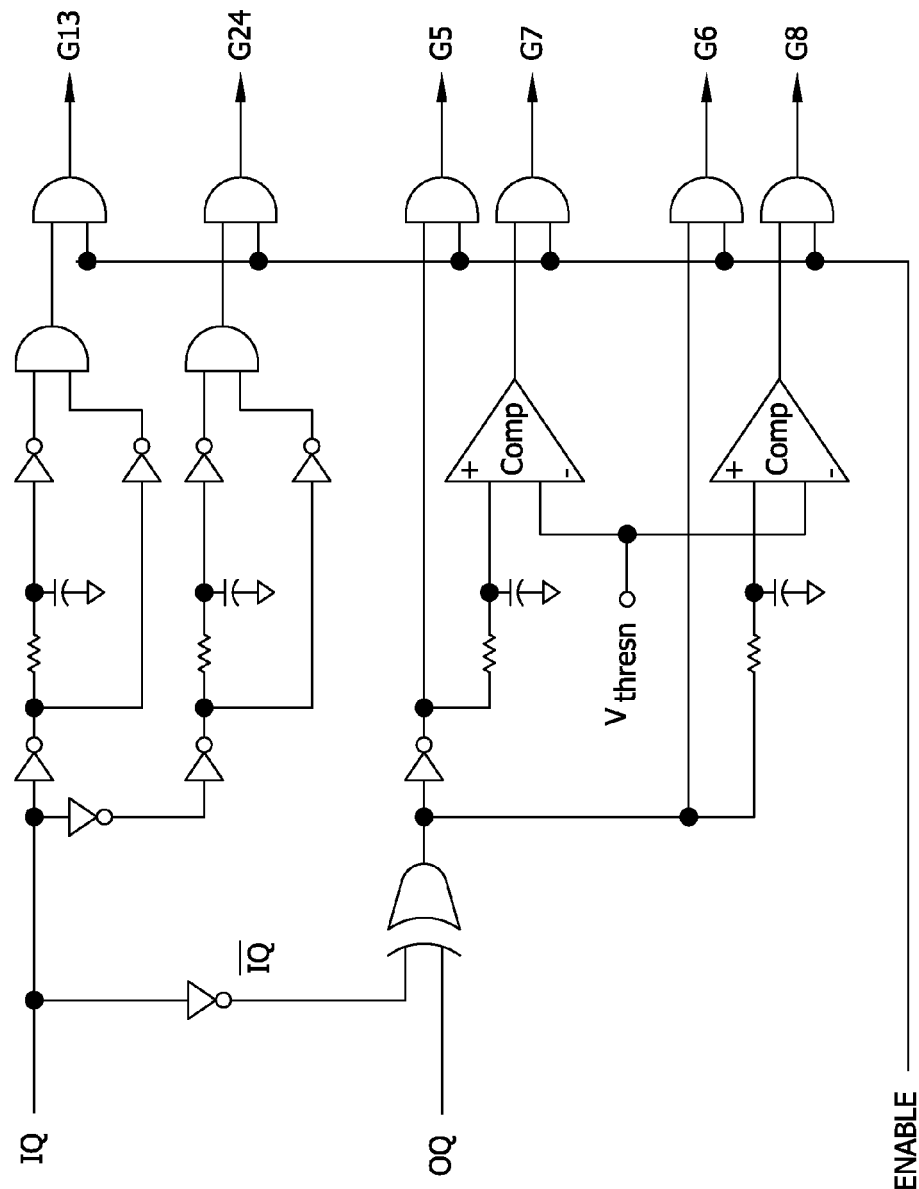
FIG. 13 is an exemplary logic gate diagram illustrating the logical operations implemented by a module control for driving module switches in accordance with an embodiment of the invention.

According to another embodiment illustrated in FIG. 13, the gate driver 606 is configured to sequence the switching operations of the secondary set of switches (e.g., switches Q5, Q6, Q7, and Q8) to control the leakage inductance associated with the transformer 404. The gate driver 606 drives the primary set of switches (e.g., Q1, Q2, Q3, and Q4) as described above in connection with FIG. 10. The gate driver 606 uses separate gate signals to drive each switch of the secondary set of switches. Specifically, gate drive signal G5 is used to drive switch Q5, gate drive signal G6 is used to drive switch Q6, gate drive signal G7 is used to drive switch Q7, and gate drive signal G8 is used to drive switch Q8. The gate driver 606 delays the switching of switch Q7 relative to Q5 by a resonant time period. The gate driver 606 likewise delays the switching of switch Q8 relative to Q6 by the resonant time period.

Figure 14:
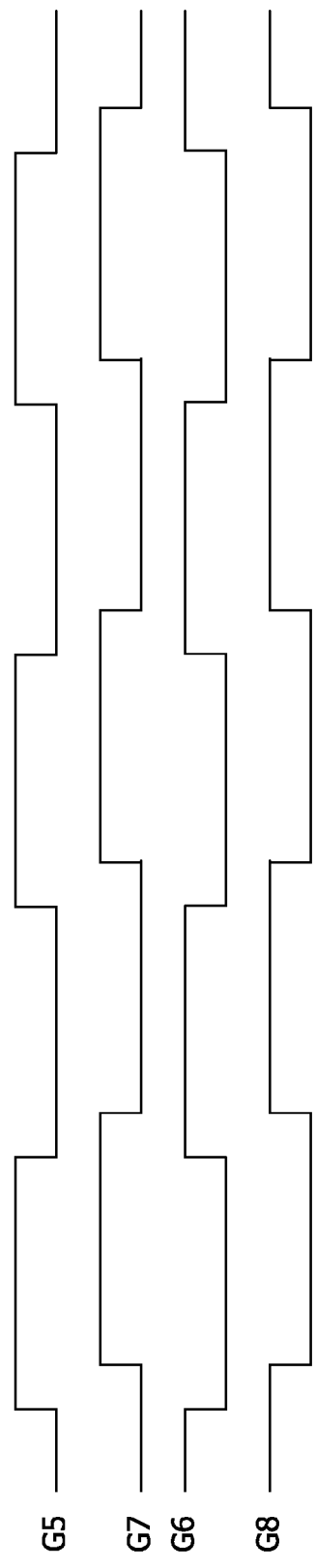
FIG. 14 illustrates an exemplary timing diagram for driving a second set of module switches in accordance with an embodiment of the invention.

FIG. 14 illustrates an exemplary timing diagram for the gate drive signals G5, G6, G7, and G8. The resonant time period is chosen so that the energy stored in leakage inductance resonates with the snubber circuit 424 (e.g., $R_{SNUB}$ and $C_{SNUB}$) and connected across the secondary winding 410 of the transformer 404, such that the energy stored is equal in magnitude but opposite in sign to the value of the energy stored just prior to the switching event. As such, delaying the switching by the resonant time period causes the leakage inductance current to reverse (e.g., resonate from positive to negative, resonate from negative to positive). The resonant snubbing provided by the gate driver 606 reduces the amount of energy that must be absorbed by the snubber circuit 424 connected across the secondary winding 410.

Thus far, the embodiments of the battery testing system 100 have been generally described in reference to the DC/DC converter 110 being configured to function as a bi-directional current source for which the output current is controlled to selectively charge and discharge a load 102 (e.g., battery, ultra capacitor, voltage source/sink). However, the DC/DC converter 110 may additionally or alternatively be configured to function as a voltage source/sink for which the output voltage provided to a load 102 (e.g., resistor, inverter, current source/sink) is controlled. According to this configuration, the battery testing system 100 may, for example, be used as a battery simulator.

Figure 15:
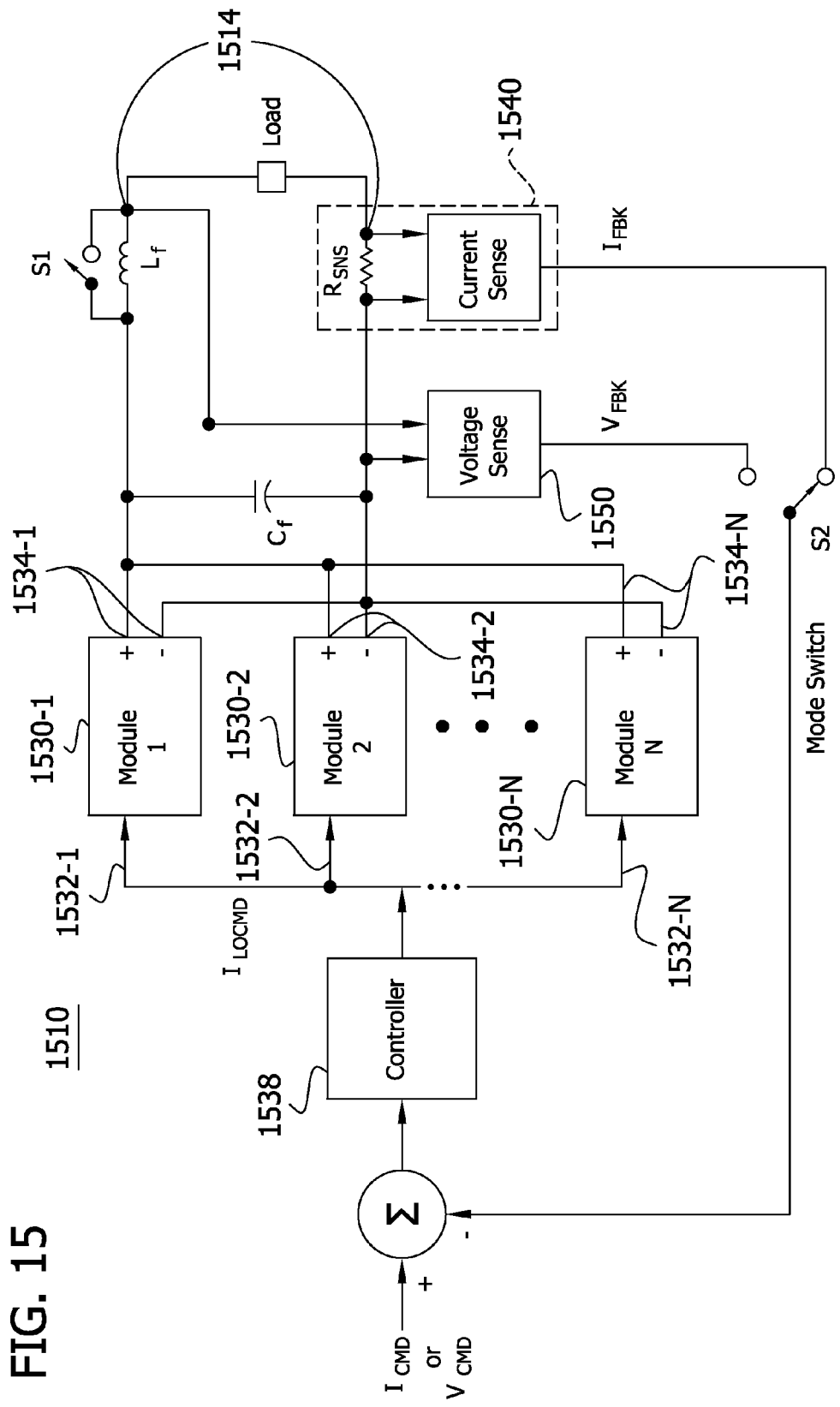
FIG. 15 is a block diagram illustrating an exemplary battery testing system in accordance with an embodiment of the invention.
Figure 16:
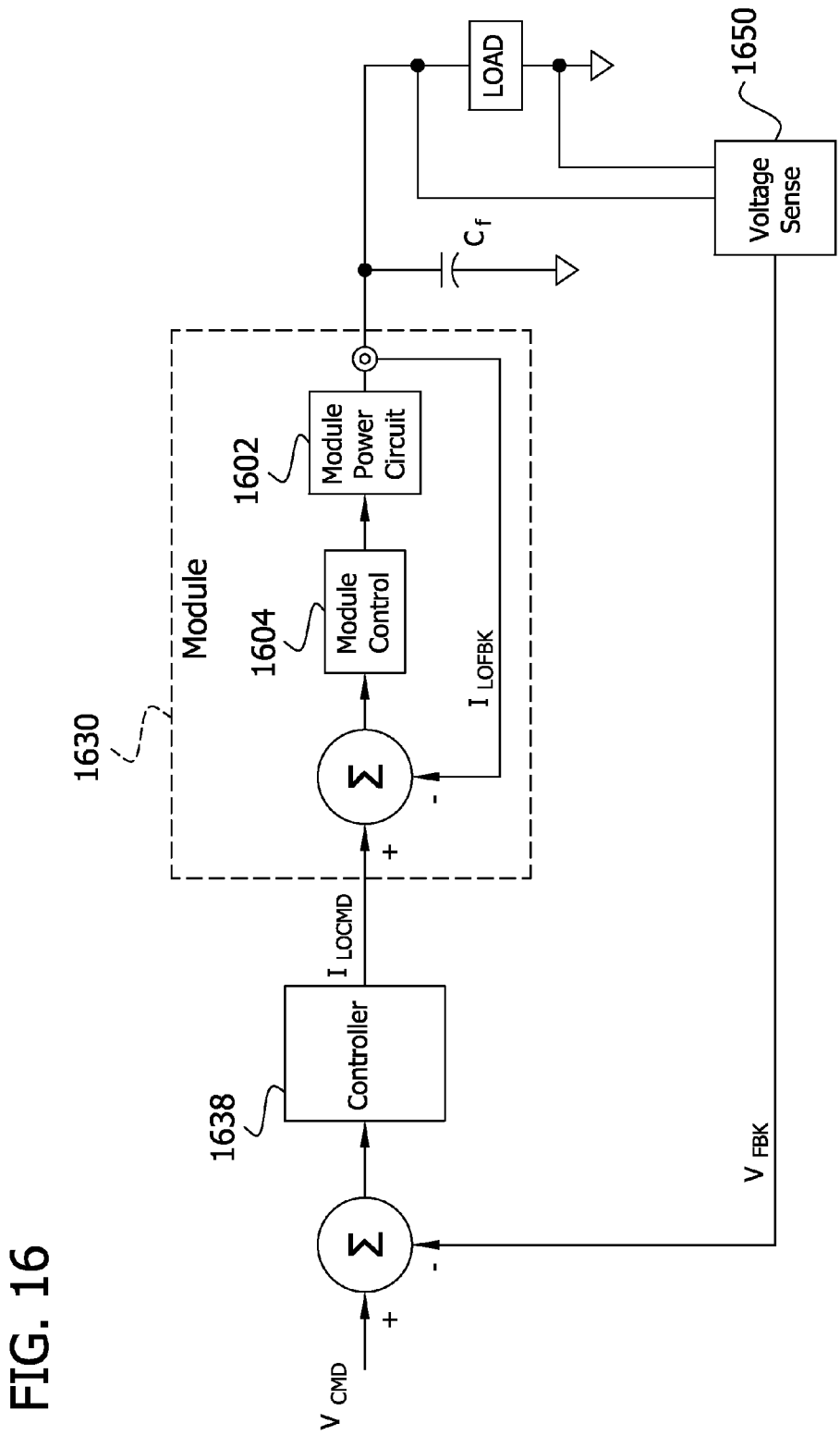
FIG. 16 is a block diagram illustrating an exemplary battery testing system in accordance with an embodiment of the invention.

FIG. 15 is a block diagram illustrating an embodiment of a DC/DC converter 1510 configured for operating selectively in a current mode and a voltage mode. FIG. 16 is a block diagram illustrating an embodiment of a DC/DC converter configured for operating exclusively in the voltage mode. The DC/DC command signal received by the DC/DC converter controller 1538 from the system controller 120 is indicative of a selected mode of operation. If the selected mode of operation is the current mode, the DC/DC converter command signal $I_{cmd}$ specifies a target DC/DC converter output current. If the selected mode of operation is the voltage mode, the DC/DC converter command signal $V_{cmd}$ specifies a target DC/DC converter output voltage. The mode of operation and/or parameters governing the DC/DC converter output may be selected via a user input received by the system controller 120. For example, the user interface 124 of the computing device 122 connected to the system controller 120 may allow a user to specify the mode of operation and enter parameters related to the output current/voltage.

As illustrated, in addition to a current sensing component 1540 (suitable for use as current sensing component 240), the DC/DC converter 1510 includes a voltage sensing component 1550 for sensing the voltage across the DC/DC converter output terminal 1514 and generating a feedback signal $V_{FBK}$ representative of the sensed voltage. The DC/DC converter 1510 includes a switch S1 connected across the filter inductor $L_f$, and a switch S2 connected between the DC/DC converter controller 1538 and the voltage and current sensing components, 1550 and 1540. When the DC/DC converter 1510 is operating in the current mode, the S1 is open so that the filter inductor $L_f$ is operatively included in the circuit. The switch S2 is connected to the current sensing component 1540 so that the current sensing component 1540 is operatively connected to the DC/DC converter controller 1538. The DC/DC converter controller 1538 operates, as described above, to selectively charge/discharge load 102.

When the DC/DC converter 1510 is operating in the voltage mode, the S1 is closed so that the filter inductor $L_f$ is operatively excluded from the circuit. The switch S2 is connected to the voltage sensing component 1550 so that the voltage sensing component 1550 is operatively connected to the DC/DC converter controller 1538. Accordingly, the DC/DC converter controller 1538 receives the feedback signal $V_{FBK}$ and compares it to the DC/DC converter command signal $V_{cmd}$. In particular, the DC/DC converter controller 1538 generates a module control signal $I_{LOCMD}$ based on the difference between the target DC/DC converter output voltage and the sensed DC/DC output voltage. The secondary module control 604 module receives the control signal $I_{LOCMD}$ and operates the secondary set of switches accordingly.

Having described the invention in detail, it will be apparent that modifications and variations are possible without departing from the scope of the invention defined in the appended claims.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawing[s] shall be interpreted as illustrative and not in a limiting sense.

What is claimed is:

1. A bi-directional DC/DC converter having an input terminal adapted for connecting to a power source and an output terminal adapted for connecting to a load, said DC/DC converter comprising:

a module adapted for connecting between the DC/DC converter input terminal and the DC/DC converter output terminal, said module comprising:

a bi-directional module input adapted for connecting to the DC/DC converter input terminal for providing a module input current to and from the DC/DC converter input terminal;

a bi-directional module output adapted for connecting to the DC/DC converter output terminal, said bi-directional module output including a module output inductor for providing a module output current to and from the DC/DC converter output terminal;

a transformer having a core, a primary winding, and a secondary winding, said primary winding wound around said core and connected to the bi-directional module input, and said secondary winding wound around said core and connected to the bi-directional module output;

a primary set of switches connected in an H-bridge configuration between the bi-directional module input and the primary winding;

a secondary set of switches connected in an H-bridge configuration between the bi-directional module output and the secondary winding;

a current sensing component for sensing the module output current, said current sensing component generating a current sense feedback signal indicative of the sensed module output current; and a hysteretic control connected to the primary set of switches and to the secondary set of switches, said hysteretic control configured to receive a primary feedback signal indicative of an electronic parameter of the primary winding and to drive the primary set of switches to control flux in the core as a function of said primary feedback signal, and said hysteretic control configured to receive the current sense feedback signal from the current sensing component and to drive the secondary set of switches to control the module output current provided by the module output inductor as a function of said current sense feedback signal.

2. The bi-directional DC/DC converter of claim 1, further comprising a plurality of said modules connected between the DC/DC converter input terminal and the DC/DC converter output terminal, wherein each module is connected in parallel with each other module of said plurality of modules.

3. The bi-directional DC/DC converter of claim 1, wherein the primary feedback signal is indicative of current through the primary winding, and wherein the hysteretic control generates a primary control signal to drive the primary set of switches to control flux in the core as a function of said primary feedback signal, said primary control signal having a pre-defined duty cycle that is adjusted when the primary feedback signal indicates that the current across the primary winding is greater than a threshold current value.

4. The bi-directional DC/DC converter of claim 1, wherein the primary feedback signal includes a primary current feedback signal and a primary voltage feedback signal, said primary current feedback signal is indicative of current across the primary winding, said primary voltage feedback signal is indicative of a voltage across the primary winding.

5. The bi-directional DC/DC converter of claim 1, further comprising a snubber circuit connected across the secondary winding for absorbing energy from leakage inductance associated with the transformer.

6. The bi-directional DC/DC converter of claim 5, wherein the snubber circuit comprises a capacitor and a resistor, said capacitor connected in series with said resistor.

7. The bi-directional DC/DC converter of claim 1, wherein the hysteretic control generates a primary control signal to drive the primary set of switches to control flux in the core as a function of said primary feedback signal, and wherein the hysteretic control generates a secondary control signal to drive the secondary set of switches to control the module output current provided by the module output inductor as a function of the current sense feedback signal, said DC/DC converter further comprising a gate driver connected to the hysteretic control and to the primary and secondary sets of switches, said gate driver configured to operate said primary set of switches as a function of the primary control signal and to operate said secondary set of switches as a function of the primary control signal and the secondary control signal.

8. The bi-directional DC/DC converter of claim 7, wherein the H-bridge configuration of the primary set of switches includes a first switch arranged diagonally with a second switch and a third switch arranged diagonally with a fourth switch, and wherein the gate driver is configured to operate the first and second switches together and to operate the third and the fourth switches together, wherein said first and second switches are operated alternately with said third and fourth switches, and wherein prior to each activation of the first and second switches and prior to each activation of the third and fourth switches there is a delay period during which the primary set of switches are off.

9. A bi-directional DC/DC converter having an input terminal adapted for connecting to a power source and an output terminal adapted for connecting to a load, said DC/DC converter comprising:

a module adapted for connecting between the DC/DC converter input terminal and the DC/DC converter output terminal, said module comprising:
 a transformer having a primary winding and a secondary winding, said transformer generating a leakage inductance;
 a primary side circuit connected between the primary winding and the DC/DC converter input terminal, said primary side circuit including a primary set of switches connected in an H-bridge configuration with the primary winding;
 a secondary side circuit connected between the secondary winding and the DC/DC converter output terminal, said secondary side circuit including a high voltage bus, a low voltage bus, and a secondary set of switches connected in an H-bridge configuration, wherein the H-bridge configuration of the secondary set of switches has a first leg and a second leg, said first leg and said second leg are connected between the high voltage bus and the low voltage bus of the secondary side circuit and coupled together by the secondary winding, said secondary set of switches including a first switch and a second switch forming the first leg, said first switch connected to the high voltage bus and said second switch connected to the low voltage bus, said secondary set of switches including a third switch and a fourth switch forming the second leg, said third switch connected to the high voltage bus and said fourth switch connected to the low voltage bus;
 a snubber circuit connected across the secondary winding for absorbing energy from the leakage inductance; and
 a module control connected to the primary side circuit for controlling the primary set of switches and to the secondary side circuit for controlling the secondary set of switches, said module control configured to alternately switch the first and the third switches and to alternately switch the second and fourth switches, said module control further configured to switch the fourth switch following a delay period from the switching of the first switch, and to switch the second switch following the delay period from the switching of the third switch, said delay period causing leakage inductance current to reverse.

10. The bi-directional DC/DC converter of claim 9, further comprising a plurality of said modules connected between the DC/DC converter input terminal and the DC/DC converter output terminal, wherein each module is connected in parallel with each other module of said plurality of modules.

11. The bi-directional DC/DC converter of claim 9, wherein the secondary side circuit further comprises an output inductor and a current sensing component, said current sensing component sensing a module output current across said output inductor and generating a feedback signal indicative of the sensed module output current, wherein said module control is configured for receiving the feedback signal from the current sensing component and controlling the secondary set of switches as a function of said feedback signal.

12. The bi-directional DC/DC converter of claim 9, wherein the secondary side circuit further comprises a voltage sensing component for sensing a module output voltage and for generating a feedback signal indicative of the sensed module output voltage, wherein said module control is configured for receiving the feedback signal from the voltage sensing component and controlling the second set of switches as a function of said feedback signal.

13. The bi-directional DC/DC converter of claim 9, further comprising a first switch snubber circuit connected across the first switch, a second switch snubber circuit connected across the second switch, a third switch snubber circuit connected across the third switch, and a fourth switch snubber circuit connected across the fourth switch, each of said first, second, third, and fourth switch snubber circuits comprising a capacitor for absorbing energy from the leakage inductance.

14. The bi-directional DC/DC converter of claim 9, wherein the module control comprises a hysteretic control connected to the primary side circuit for controlling the primary set of switches and to the secondary side circuit for controlling the secondary set of switches.

15. A bi-directional battery testing apparatus comprising:
a power input adapted for connecting to a power source;
a load output adapted for connecting to a load;
a plurality of modules connected between the power input and the load output, each module of said plurality of modules connected in parallel with each other module of said plurality of modules, wherein each module comprises a primary set of switches having an H-bridge configuration, a secondary set of switches having an H-bridge configuration, a transformer isolating said primary set of switches from said secondary set of switches, and a hysteretic control for driving said secondary set of switches to control a module output parameter;
a current sensing component connected to the load output for sensing a total current at said load output and for generating a current feedback signal representative of the sensed total current;
a controller for receiving the current feedback signal from the current sensing component and responsive to said receiving for providing a current module command signal to the hysteretic control of each of the plurality of modules, said current module command signal is based on a difference between the sensed total current and a target current, wherein said hysteretic control drives the secondary set of switches as a function of said current module command signal to control a module output current;
a voltage sensing component connected to the load output for sensing a total voltage at said load output and for generating a voltage feedback signal representative of the sensed total voltage,
wherein said controller is further configured for receiving the voltage feedback signal from the voltage sensing component and responsive to said receiving for providing a voltage module command signal to the hysteretic control of each of the plurality of modules, said voltage module command signal is based on a difference between the sensed total voltage and a target voltage, wherein the hysteretic control drives the secondary set of switches as a function of said voltage module command signal to control a module output voltage; and
a switch connected between the controller and the current and voltage sensing components, wherein the battery testing apparatus is operated in a current mode when the switch is closed across the current sensing component so that the current sensing component is connected to the controller and the controller receives the current feedback signal, and wherein the battery testing apparatus is operated in a voltage mode when the switch is closed across the voltage sensing component so that the voltage sensing component is connected to the controller and the controller receives the voltage feedback signal.

16. The bi-directional battery testing apparatus of claim 15, wherein the plurality of modules further comprises a module output inductor for providing the module output current, and wherein said hysteretic control drives the secondary set of switches as a function of the module output current provided by the output inductor.

17. The bi-directional battery testing apparatus of claim 15, further comprising a filter connected between the plurality of modules and the load output.

18. The bi-directional battery testing apparatus of claim 15, further comprising an AC/DC converter connected between the power input and the plurality of modules.

19. The bi-directional battery testing apparatus of claim 15, wherein the target current is based on user input.

* * * * *